United States Patent [19]

Diddens

[11] 4,083,040
[45] Apr. 4, 1978

[54] TRACE LOCATOR FOR A MULTI-TRACE RECORDER

[75] Inventor: Paul A. Diddens, Denver, Colo.

[73] Assignee: Honeywell Inc., Minneapolis, Mich.

[21] Appl. No.: 682,021

[22] Filed: Apr. 30, 1976

[51] Int. Cl.² .................... G08B 5/36; G01D 7/00; G06M 3/06

[52] U.S. Cl. .................... 340/248 A; 235/92 EA; 324/99 D; 340/336; 346/17; 346/35

[58] Field of Search ............... 340/324 R, 336, 248 A; 324/99 D, 100; 346/76 R, 110 R, 35, 17; 235/92 EA

[56] References Cited

U.S. PATENT DOCUMENTS

| 3,465,360 | 9/1969 | Hackley et al. | 346/35 X |
|---|---|---|---|
| 3,662,373 | 5/1972 | Schumann | 340/324 A |
| 3,746,843 | 7/1973 | Wesner | 235/92 EA |
| 3,754,121 | 8/1973 | Delay et al. | 340/324 R |
| 3,876,933 | 4/1975 | Herrington | 324/99 D |

Primary Examiner—David L. Trafton
Attorney, Agent, or Firm—Laurence J. Marhoefer; Lockwood D. Burton; Mitchell J. Halista

[57] ABSTRACT

A trace locator for identifying in a visual display the position on a recording medium of a recorded trace representing an input signal in a multi-trace recorder. The trace position may be displayed without a movement of the recording medium to enable the possible trace to be located and positioned by observing the visual display. The visual display is sequentially advanced by successive clock signals until a predetermined amplitude of an input signal to be displayed is reached. The trace location is displayed for a preset period of time after which the display is cleared prior to a subsequent display of the trace location for either the same input signal or another input signal.

7 Claims, 2 Drawing Figures

TRACE LOCATOR FOR A MULTI-TRACE RECORDER

BACKGROUND OF THE INVENTION

1. Field of the Invention

The present invention relates to multi-trace recorders. More specifically, the present invention is directed to a trace locator for identifying a position of recording trace in a multi-trace recorder.

2. Description of the Prior Art

One prior art type of multi-trace recorder utilizes a composite recording head having a stack of a plurality of individual recording elements extending across the width of the recording medium e.g., see U.S. Pat. No. 3,465,360. The problem in this type of recorder has been to position on the recording medium the particular trace being recorded. In the prior art there have been various proposals for identifying the recording trace such as recording individual traces in respective colors, printing nubmers alongside individual traces to identify the trace, recording each trace in a different configuration of dots and dashes, etc. While such prior art arrangements are effective to provide an identification for individual traces on the multi-trace recorder, in a recorder which is time-shared to record a plurality of traces on a single record member there is still the need to position the trace on the recording medium and to preset the range, or limits, of traces currently being recorded. The prior art recorders were not suitable for providing such position and limit identification when the recorder was not running. In other words, the trace position was determined by running the recording medium past the recording head while the gain or signal dividing elements of the input signal conditioning circuit were adjusted with an applied test input signal until the zero input signal location and the input signal limit locations were located in desired positions on the recording medium. These locations were identified by record lines on the recording medium corresponding to the test signal being used to adjust the recording system.

SUMMARY OF THE INVENTION

Accordingly, an object of the present invention is to provide a trace locator for identifying the position of recording traces on a recording medium of a multi-trace recorder.

Another object of the present invention is to provide a trace locator for identifying a trace position on a recording medium independently of an actual recording on the recording medium.

In accomplishing these and other objects, there has been provided, in accordance with the present invention, a trace locator for identifying a position of a recording trace on a multi-trace recorder and having a digital read-out for displaying a particular recording trace position identification. The trace position identification is correlated with the operation of a stacked multi-element recording head extending across a recording medium to concurrently identify the element in the composite head being used to record the corresponding trace on the recording medium.

BRIEF DESCRIPTION OF THE DRAWINGS

A better understanding of the present invention may be had when the following detailed description is read in connection with the accompanying drawings, in which.

DESCRIPTION OF THE PREFERRED EMBODIMENT

Figure 1:
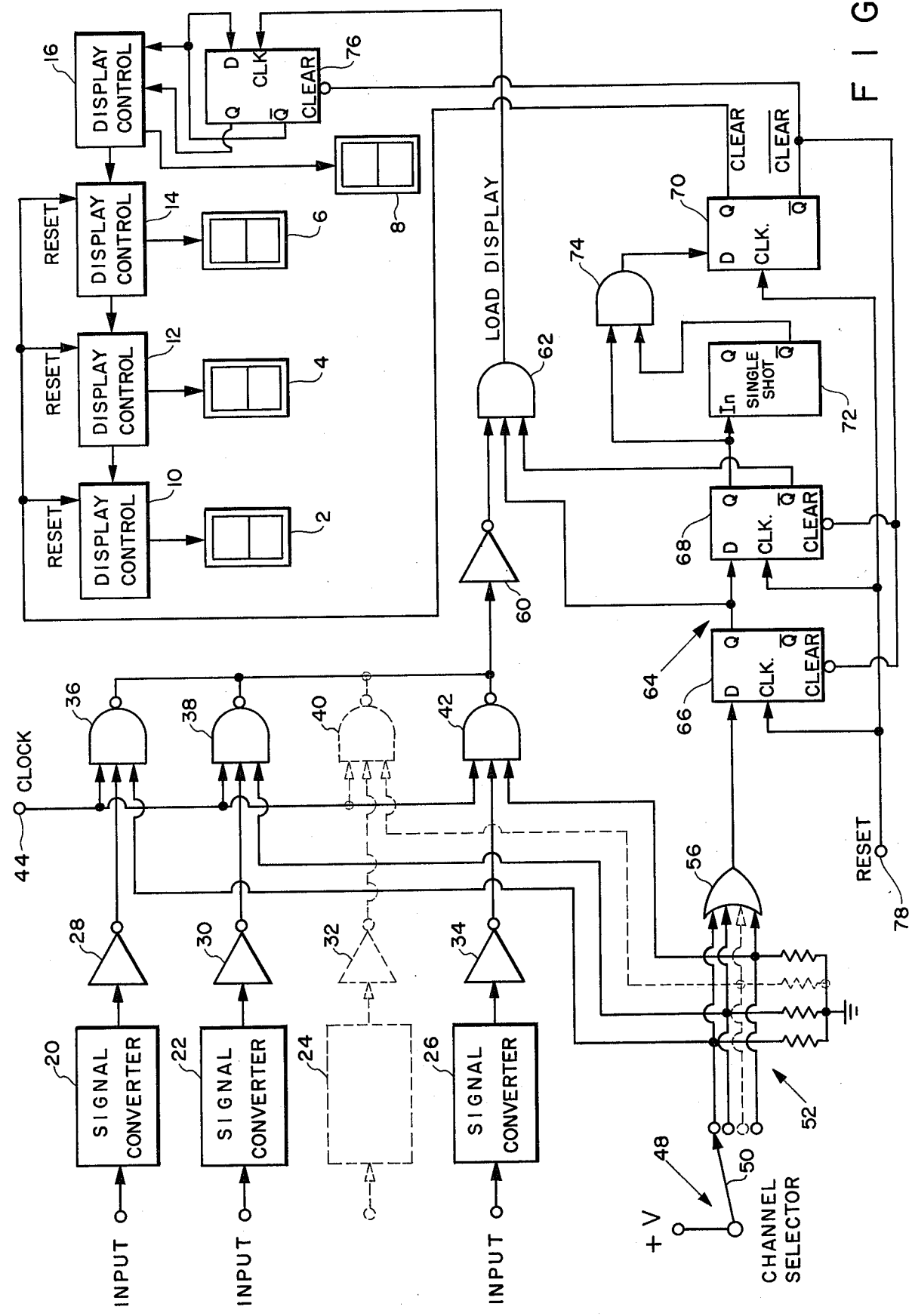
FIG. 1 is a schematic illustration of the trace locator circuit embodying the present invention.

Referring to FIG. 1 in more detail, there is shown a trace locator circuit for providing a digital read-out on a plurality of digital display devices 2, 4, 6 and 8. The display devices 2 to 8 are controlled by respective display control circuits 10, 12, 14 and 16. The display devices 2, 4, 6 and 8 are of a conventional structure employing a segmented digital readout while the display controls 10, 12, 14 and 16 are also of a conventional type such as the RCA CD4033A manufactured by the RCA Corporation, Somerville, N.J. An input signal to be displayed on a conventional multi-trace recorder (not shown) is applied to a respective one of a plurality of analog input signal converters 20, 22, 24 and 26. The recorder is of the type using a stacked, or layered, multi-element recording head extending across the width of the recording medium, e.g., a 200mm recording medium would be used with a 400 element head to cover 0.5mm recording steps. The analog input signal converters 20 to 26 are hereinafter identified as converters 20 to 26. These converters 20 to 26 may each be of a conventional type employing a reference signal arranged as a ramp signal which is compared with the input signal by a comparator until the ramp signal amplitude is equal to the input signal. At this time, the comparator output signal changes polarity and the concurrent ramp signal amplitude is gated to the output of the converter. These output signals of the converters 20 to 26 are selectively and individually applied to the stacked recording head through conventional circuitry whereby the amplitude of the selected converter output signal determines the selection of a recording element in the recording head.

The comparator signal from each of the converters 20 to 26 is applied through a respective one of a plurality of logical inverters 28, 30, 32, and 34. The output from each of the logical inverters 28 to 34 is applied as one input signal to a respective one of a plurality of three-input NAND gates 36, 38, 40 and 42. A second signal for each of the NAND gates 36 to 42 is supplied from a clock generator (not shown) supplying clock signals to a clock input terminal 44. A third input signal for each of the NAND gates 36 to 42 is supplied from a channel selector circuit 48. The channel selector circuit 48 includes a switch 50 arranged to selectively apply an energizing signal to a resistor network 52. The selective application of an energizing signal to one of the resistors in the resistor network 52 is effective to develop a signal across the selected one of the resistors in the resistor network 52. This developed signal is applied to a corresponding one of the NAND gates 36 to 42. The developed signals from the resistor network 52 are also applied concurrently to respective inputs of a multi-input OR gate 56.

The output signals from each of the NAND gates 36 to 42 are applied through a logical inverter 60 to one input of a three-input AND gate 62. The second and third inputs for the AND gate 62 are obtained from a display clearing circuit 64. The display clearing circuit 64 includes a first "D" flip-flop 66, a second "D" flip-flop 70 and a single shot 72. The output of the OR gate 56 is applied to the "D" input of the first "D" flip-flop 66. The "Q" output of the first flip-flop 66 is applied to the "D" input of the second flip-flop 68 and to a second input of the three-input AND gate 62. The "Q" output of the second flip-flop 68 is applied to the input of the single shot 72 and to a first input of a two-input AND gate 74. The "$\overline{Q}$" output of the second flip-flop 68 is applied to a third input of the three-input AND gate 62. The "$\overline{Q}$" output of the single-shot 72 is applied to a second input of the two-input AND gate 74. The output of the AND gate 74 is applied to the "D" input of the third flip-flop 70. The "Q" output of the third flip-flop 70 is applied to the "Reset" input of the first, second and third display control circuits 10, 12, 14. The "$\overline{Q}$" output of the third flip-flop 70 is applied to a "Clear" input of the first and second flip-flops 66, 68 and a fourth flip-flop 76.

An output signal from the AND gate 62 is applied to the "Clock" input of the fourth flip-flop 76. The "$\overline{Q}$" output of the fourth flip-flop 76 is connected to the forth display control 16 and to the "D" input of the forth flip-flop 76. The "Q" output of the fourth flip-flop 76 is also connected to the display control 16. A "Reset" signal is applied to a "Reset" signal input terminal 78 which is connected to the "Clock" inputs of the first, second and third flip-flops 66, 68 and 70. The "Reset" signal is derived from a system clock signal, as described hereinafter, generated by a master system oscillator (not shown).

MODE OF OPERATION

In operation, the trace locator circuit shown in FIG. 1 is effective to provide a digital display on the digital display devices 2 to 8 identifying the recording element in a stacked multi-element recording head (not shown) currently being energized to produce a recording trace. Inasmuch as the recording head is conventionally located across the width of the recording medium, the read-out of the recording element identification also corresponds to the location of the recording line to be produced by that recording element on the recording medium. For example, assuming the recording head has four hundred recording elements which cover two hundred MM of trace position, or deflection, whereby the recording elements each cover 0.5 MM, the digital readout is arranged to identify any one of the group of four hundred recording elements by displaying any number between 000.0 and 200.0 MM in 0.5 MM steps.

Three basic signals are used to operate the trace locator, or position identifying, circuit shown in FIG. 1 These signals are derived from a master clock which may be any suitable prior art oscillator circuit arranged to provide a basic train of clock pulses with auxiliary signals being developed in synchronism from selected ones of the clock pulses. Using the example of the four hundred element recording head, the basic clock signal is a symmetrical series of clock pulses from which a group of four hundred evenly spaced pulses is extracted at periodic intervals. The first one of each group of 400 pulses is arranged to trigger a ramp signal generating circuit for providing a ramp signal to the converter circuits 20 to 26. A reset signal is also developed at the end of each ramp signal for application to the reset terminal 78 shown in FIG. 1. The aforesaid ramp signal, the reset signal and the clock signal are shown in the first three waveshapes diagrams of FIG. 2, respectively.

The converters 20 to 26 each operate to convert a respective analog input signal into a corresponding analog amplitude signal for controlling the recording process of a multi-electrode recording head (not shown). Specifically, the amplitude of this output signal (not shown) from a converter is arranged to energize a respective recording element in the multi-element recording head according to the input signal amplitude to produce a recording trace at a position corresponding to the location of a selected recording element. Thus, a varying amplitude output signal produced by the converter in response to a varying amplitude input signal to the converter would be effective to select sequential ones of the recording elements corresponding to the instantaneous amplitude of the converter output signal. The recording head energizing details of the converters 20 to 26 and the multi-element recording head, which are well-known in the art e.g., the recording apparatus shown in U.S. Pat. No. 3,465,360, do not form a part of the present invention and accordingly are not shown in detail.

The converters 22 to 26 each also incorporate a comparator for comparing a converter input signal with the ramp signal and producing an output signal indicative of the relationship therebetween. This output signal of each of the comparators is shown as a converter output signal and is applied from each of the converters 20 to 26 to respective ones of a plurality of logical inverters 28 to 34, respectively. The output signals from the inverters 28 to 34 are, in turn, applied to respective ones of the NAND gates 36 to 42. Although all of the converter output signals may be concurrently present inasmuch as all of the converters 20 to 26 may have input signals concurrently applied thereto, the NAND gates 36 to 42 are also controlled by the presence of a clock signal supplied via a clock input terminal 44 and by an enabling signal supplied from the channel selector switch 48. Assuming the channel selector switch 48 is in the position illustrated in FIG. 1, the first output signal from the first converter 20 and inverter 28 and an output signal from the resistor network 52 would be applied to the first NAND gate 36. Thus, the first NAND gate 36 would be enabled to pass the clock signal from the clock input terminal 44. When the output signal of the first converter 20 has the desired polarity indicating the detection of a predetermined relationship between the compared signals by the comparator within the first converter 20, this output signal is inverted by the logical inverter 28 and is applied to the NAND gate 36. For example, the output signal from the comparator 20 can have a first polarity when the input signal amplitude is lower than the ramp signal and a second polarity when it is higher than the ramp signal. Inasmuch as the first NAND gate 36 is concurrently receiving output signal from the resistor network 52 as determined by the illustrated position of the selector switch 48, the next clock signal applied to the first NAND gate 36 from the clock terminal 44 is effective to produce an output signal from the first NAND gate 36.

This output signal is inverted by the logical inverter 60 and is applied to the AND gate 62. Concurrently, an output signal from the resistor network 52 is applied to the OR gate 56 to produce a high level, or logical "1," output therefrom. This high level output signal is applied to the "D" input of the first flip-flop 64. A first "reset" signal at the beginning of a first display frame which is at the time preceding the beginning of the first ramp signal, as shown in the "reset" waveshape of FIG.

2, is applied to the "clock" input of the first flip-flop 66. This high level clock signal enables the first flip-flop 66 to assume the high level state present at its "D" input whereby the "Q" output thereof goes to a high level output signal. This high level output signal from the "Q" output is applied to the "D" input of the second flip-flop 68 and to the AND gate 62. Inasmuch as the $\overline{Q}$ output of the second flip-flop 68 is a high level signal at this time and is applied to the AND gate 62, the AND gate 62 is enabled to produce a high level signal at its output for each "clock" signal from the first NAND gate. The output signal from the AND gate 62 is applied to the "clock" input of the fourth flip-flop 76. Thus, during the time that the first NAND gate 36 is enabled, the clock signals from the clock input terminal 44 are applied through the logical inverter 60 and the AND gate 62 to the "clock" input of the fourth flip-flop 76.

The flow of "clock" signals from the clock input terminal 44 is continued until the occurrence of the detection by the comparator in the first converter 20 of a change in the relationship between the ramp signal and the input signal being compared thereto. This change in their relationship is effective to change the polarity of the output signal from the converter 20 as shown in the FIG. 2 waveshape "Channel 1 Input Converter" which, in turn, closes the first NAND gate 36 by terminating the enabling signal thereto. While the "clock" signals from the clock input terminal 44 are applied to the fourth flip-flop 76 "Clock" input terminal, they are effective to change the state of this flip-flop for each clock signal applied thereto. Thus, the "Q" and "$\overline{Q}$" output terminals of the fourth flip-flop 76 change state on each clock input signal.

Figure 2:
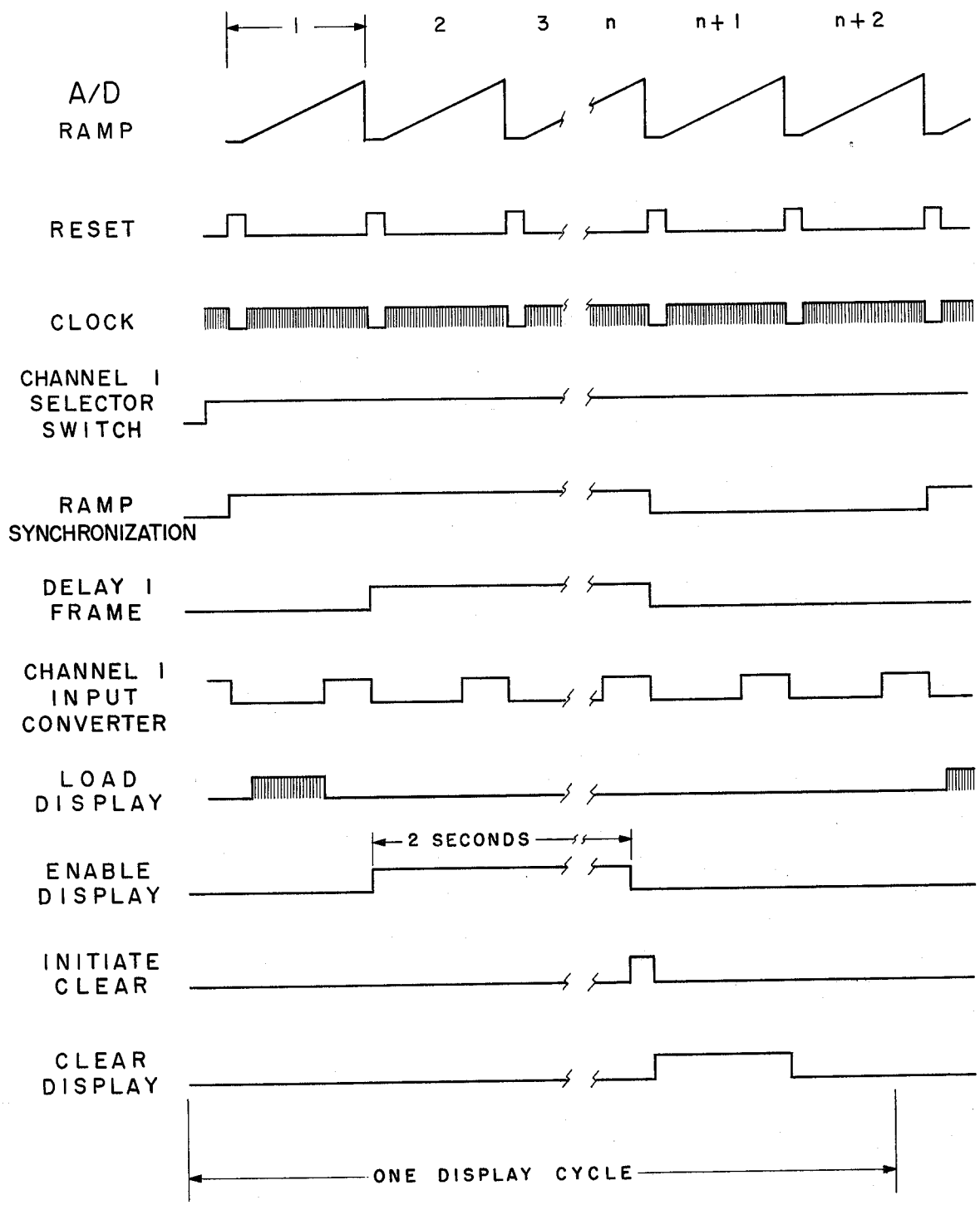
FIG. 2 is a waveshape diagram illustrating the operation of the circuit shown in FIG. 1.

The displays 2, 4, 6 and 8 are controlled by the display controls 10, 12, 14 and 16, respectively. The first three displays 2, 4, and 6 are arranged to be operated as conventional seven segment displays and the display controls 10, 12 and 14 are arranged as conventional decade dividers with decoded seven segment display outputs. On the other hand, the display control 16 for the fourth display 8 is arranged to change the fourth display 8 between a displayed five and a displayed zero for each clock input signal applied to the fourth flip-flop 76. Thus, starting with an initial display of all zeros on the displays 2 to 8, the first clock pulse is effective to produce a display of a "five" on the fourth display element 8. The next clock pulse changes the state of the fourth flip-flop 76 to produce a display of a zero on the fourth display element 8, and a signal is applied from the fourth display control 16 to the third display control 14 to produce a display of a "one" on the third display 6. The display process is continued, as shown in FIG. 2 waveshape "Load Display," sequentially through the second and first displays 12 and 10 until the clock train is terminated by the closing of the first NAND gate 36, as described above. The final readout on the displays 2 to 8 at this time is an indication of the position of a recording trace on the recording medium and an indication of the corresponding recording element in the multielement recording head.

Prior to the beginning of the second ramp shown in the first waveshape in FIG. 2, another "reset" signal is generated and is applied to the "clock" input of the first flip-flop 66 and the second flip-flop 68. Inasmuch as the "Q" output of the first flip-flop 66 is high at this time, this high level output from the "Q" output of the first flip-flop 66 which is applied to the "D" input of the second flip-flop 68 is transferred to the "Q" output of the second flip-flop 68. The high level output of the "Q" output of the second flip-flop 68 is applied to the input of the single-shot 72 to start its operation. The single-shot 72 is arranged to produce a pulse of a predetermined length, e.g., a 2 second pulse, as shown in the waveshaped entitled "Enable Display" in FIG. 2. This high output at the Q output of the single-shot 72 is effective to produce a low output on the "$\overline{Q}$" output of the single-shot 72. This "$\overline{Q}$" output signal is applied to the second AND gate 74 to disable this AND gate even though a high level output signal from the Q output of the second flip-flop 68 is concurrently being applied thereto. At the end of the two second period, the "$\overline{Q}$" output of the single-shot 72 is returned to a high level state to allow the second AND gate 74 to again produce a high level output signal. This high level output signal from the second AND gate 74 is applied to the "D" input of the third flip-flop 70.

The next ramp signal following the two second delay produced by the single-shot 72 is preceded by another "reset" pulse which is applied to the "clock" input of the third flip-flop 70 to enable the high input signal at its "D" input to be transferred to its "Q" output. Concurrently, the "$\overline{Q}$" output of the third flip-flop 70 is in a low level state. The "Q" and "$\overline{Q}$" outputs of the third flip-flop 70 are concurrently applied as "clear" signals to clear the first, second and fourth flip-flops 66, 68 and 76 and to reset the display controls 10, 12 and 14. Inasmuch as the "$\overline{Q}$" output of the third flip-flop 70 is a low level signal, logical inverters are provided at the inputs of the first, second and fourth flip-flops to change the logical level of the "$\overline{Q}$" output signal to one suitable for clearing these flip-flops. The clearing of the fourth flip-flop 76 is effective to produce a zero display on the fourth display 8 by the fourth display control 16.

Prior to the next ramp, another "reset" signal is generated and is applied to the "clock" input of the third flip-flop 70 to reset this flip-flop wherein the "Q" and "$\overline{Q}$" outputs switch their states. At this time a first display cycle is completed, the circuit is initialized and is ready for another display cycle starting at the next "reset" signal which is generated before the beginning of the next ramp to repeat the above cycle. In the event that the channel selector 48 remains unchanged the trace locator circuit will again display, on the display elements 2 to 8, the trace position of the first channel. Thus, the trace locator circuit is effective to display the distance from the edge of the recording medium of the recording trace for the particular input channel selected without the necessity for actually running the recording medium past the recording head. This distance display is also the identification of the recording element in the multi-element recording head being used to record that input signal. By adjusting the gain of the converter circuits, the operation of the display can be adjusted to correlate the display the identification of the recording element and trace location with the actual operation of recording element selection by the converters 20 to 26.

Accordingly, it may be seen that there has been provided, in accordance with the present invention, a trace locator circuit for identifying a trace location in a multi-trace recorder independently of the movement of a recording medium in the recorder.

The embodiments of the invention in which an exclusive property or privilege is claimed are defined as follows:

1. A trace locator circuit for identifying a record trace location on a recording medium in a recorder having a multi-element layered recording head comprising input signal converter means for converting an input signal to be recorded to a corresponding recording head energizing signal, said converter means concurrently developing an output signal defining a time period representative of the amplitude of said energizing signal, display means arranged to display a representation of a sum of a succession of input signals applied to said display means, signal gate means connected between said converter means and said display means and being responsive to said output signal and to a gating signal to pass gate input signals through said gate means as input signals to said display means, clock signal terminal means arranged to be connected to a source of clock signals and being connected to said gate means to apply the clock signals to said gate means as said gate input signals and display enabling means connected to said gate means and to said display means to periodically apply said gating signal in combination with said output signal to said gating means to enable said gating means to pass said gate input signals and to clear said display means between said periodic applications of said gating signals to said gating means.

2. A trace locator circuit as set forth in claim 1 wherein said converter means includes a signal comparator means arranged to compare the input signal to be recorded with a reference signal and to produce said output signal during a detection of a predetermined relationship between the compared signals and first circuit means for connecting said comparator means to a source of said reference signal for comparing with said input signal to be recorded.

3. A trace locator circuit as set forth in claim 1 wherein said gate means includes a first signal gate having said clock signals and said output signal applied thereto to pass said clock signals during said output signal and a second signal gate having signals passed by said first signal gate and said gating signal applied thereto to pass said signals from said first signal gate during said gating signal.

4. A trace locator circuit as set forth in claim 1 and including a second input signal converter means for converting a second input signal to be recorded to a second corresponding recording head energizing signal, said second converter means concurrently developing an input signal defining a second time period representative of the amplitude of said second energizing signal, said gate means being connected to said first-mentioned and said second signal converter means, and input signal selection means connected to said gate means to selectively apply a first enabling signal to said gate means to allow said gate means to pass said clock signals through said gate means during said first-mentioned time period and a second enabling signal to said gate means to pass said clock signals through said gate means during said second time period, said gate means being responsive to said first and second enabling signals, said output signal and said gating signal to pass said gate input signals.

5. A trace locator circuit as set forth in claim 4 wherein said gate means a first signal gate having said clock signals and said output signal applied thereto to pass said clock signals during said output signal and a second signal gate having said first signal gate and said gating signal applied thereto to pass said signals from said first signal gate during said gating signal.

6. A trace locator circuit as set forth in claim 1 wherein said display means includes a plurality of seven segment digital display elements for displaying a maximum number equal to the number of elements in the layered recording head.

7. A trace locator circuit as set forth in claim 1 wherein said input signal converter means includes a plurality of input signal converters and a plurality of input signal terminals connected to respective ones of said input signal converters, each of said input signal converters converting a respective input signal to be recorded to a corresponding recording head energizing signal and concurrently developing an output signal defining a time period representative of the amplitude of said respective energizing signal, and wherein said gate means includes a plurality of signal gates with each of said gates being connected to an output of a corresponding one of said signal converters, said clock signal terminal means being connected to each of said signal gates to apply said clock signals to each of said signal gates and said display enabling means being connected between a joint output of said signal gates and said display means and a further including an input signal selector means for selectively applying an input signal representative signal to a corresponding one of said signal gates to enable a signal gate having an input signal selector signal applied thereto.

* * * * *